(12) United States Patent
Razzell

(10) Patent No.: US 10,735,104 B2
(45) Date of Patent: *Aug. 4, 2020

(54) SYSTEMS AND METHODS FOR ANALOG ELECTRONIC POLARIZATION CONTROL FOR COHERENT OPTICAL RECEIVERS

(71) Applicant: Maxim Integrated Products, Inc., San Jose, CA (US)

(72) Inventor: Charles John Razzell, Pleasanton, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/379,302

(22) Filed: Apr. 9, 2019

(65) Prior Publication Data
US 2019/0349093 A1 Nov. 14, 2019

Related U.S. Application Data

(60) Provisional application No. 62/668,643, filed on May 8, 2018.

(51) Int. Cl.
*H04B 10/61* (2013.01)
*H03G 3/30* (2006.01)
*H03F 3/45* (2006.01)

(52) U.S. Cl.
CPC .......... *H04B 10/6162* (2013.01); *H03F 3/45* (2013.01); *H03G 3/30* (2013.01); *H04B 10/6166* (2013.01)

(58) Field of Classification Search
CPC ............ H04B 10/6162; H04B 10/6166; H04B 10/614; H04B 10/6151; H04B 10/5561;
(Continued)

(56) References Cited

U.S. PATENT DOCUMENTS

| 8,301,039 B2 | 10/2012 | Nishihara et al. | |
| 2015/0117872 A1* | 4/2015 | Lyubomirsky | H04J 14/06 398/205 |
| 2015/0162991 A1 | 6/2015 | Gupta et al. | |

FOREIGN PATENT DOCUMENTS

WO  WO2018035174 A1  2/2018

OTHER PUBLICATIONS

NTT Technical Review, 9(3):1-6, Mar. 2011, "Photodiodes and Transimpedance Amplifiers for 100-Gbit/s Digital Coherent Optical Communications," NTT Photonics Laboratories Atsugi-shi, 243-0198 Japan.

* cited by examiner

*Primary Examiner* — Leslie C Pascal
(74) *Attorney, Agent, or Firm* — North Weber & Baugh LLP

(57) ABSTRACT

Described herein are systems and methods that manage polarization in coherent optical receivers by using analog signal processing that eliminates the need for ultra-fast, power-hungry ADCs and DSPs and that would require digitization of the full-bandwidth signal path and result in bulky and expensive circuit designs. Various embodiments of the invention provide polarization correction by using an analog polarization correction circuit that implements the equivalent of two matrix operations. This is accomplished by using analog electronics that comprises a combination of variable and unity gain amplifiers to align polarizations of input signals to generate a polarization-corrected output signal that is further aligned with the polarization frame of reference of the receiver.

20 Claims, 9 Drawing Sheets

(58) Field of Classification Search
CPC ...... H03F 3/45; H03F 3/211; H03F 2200/192; H03F 2200/336; H03G 3/30; H03G 3/3084

See application file for complete search history.

600

SYSTEMS AND METHODS FOR ANALOG ELECTRONIC POLARIZATION CONTROL FOR COHERENT OPTICAL RECEIVERS

CROSS-REFERENCE TO RELATED APPLICATION

This patent application is related to and claims priority benefit under 35 U.S.C. § 119(e) to commonly-owned U.S. Provisional Patent Application No. 62/668,643, entitled "Systems and Methods for Analog Electronic Polarization Control for Coherent Optical Receivers," naming as inventor Charles John Razzell, and filed May 8, 2018, which patent document is incorporated by reference herein in its entirety and for all purposes.

A. TECHNICAL FIELD

The present disclosure relates generally to electrical signal processing. More particularly, the present disclosure related to systems and methods for controlling polarization in electro-optical communication systems.

B. BACKGROUND

Coherent optical communication links at rates of 100 Gbps/λ and higher have been commercially deployed in recent years. These systems heavily rely on power-hungry (e.g., >10 W) digital signal processing (DSP) devices even for cutting-edge CMOS process technologies (e.g., 16 nm linewidths in commercial products). The ability to support unamplified links of up to 80 km at such high rates justifies the cost of powerful DSPs in light of a reduction of other capital expenses and operating costs. On the other hand, the ever-increasing demand for high bandwidth communications within data centers is pushing direct-detection, intensity modulation four-level pulse amplitude modulation (PAM4) schemes to their limits.

For example, IEEE P802.3cd is expected to standardize as one of its PHY options, 100GBASE-DR, 100 Gb/s serial transmission over one wavelength using PAM4 over of single-mode fiber >500 m. Results from contributors to the IEEE P802.3cd task group, shown in FIG. 1 (IEEE SMF Task Group Contribution by Marco Mazzini (Cisco), August 2014), indicate that 56 Gbaud/112 Gbps PAM4 requires a feed-forward equalizer to open the eye. Although some approaches have demonstrated feasibility, numerous contributions indicate that meeting link budget margins for this type of PHY option remains challenging.

Accordingly, what is needed are systems and methods that obtain the benefits of coherent modulation schemes, while avoiding the major cost and power consumption of DSP-heavy approaches that oftentimes require extremely high sample rate ADCs and equalizers.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE EMBODIMENTS

Figure 1:
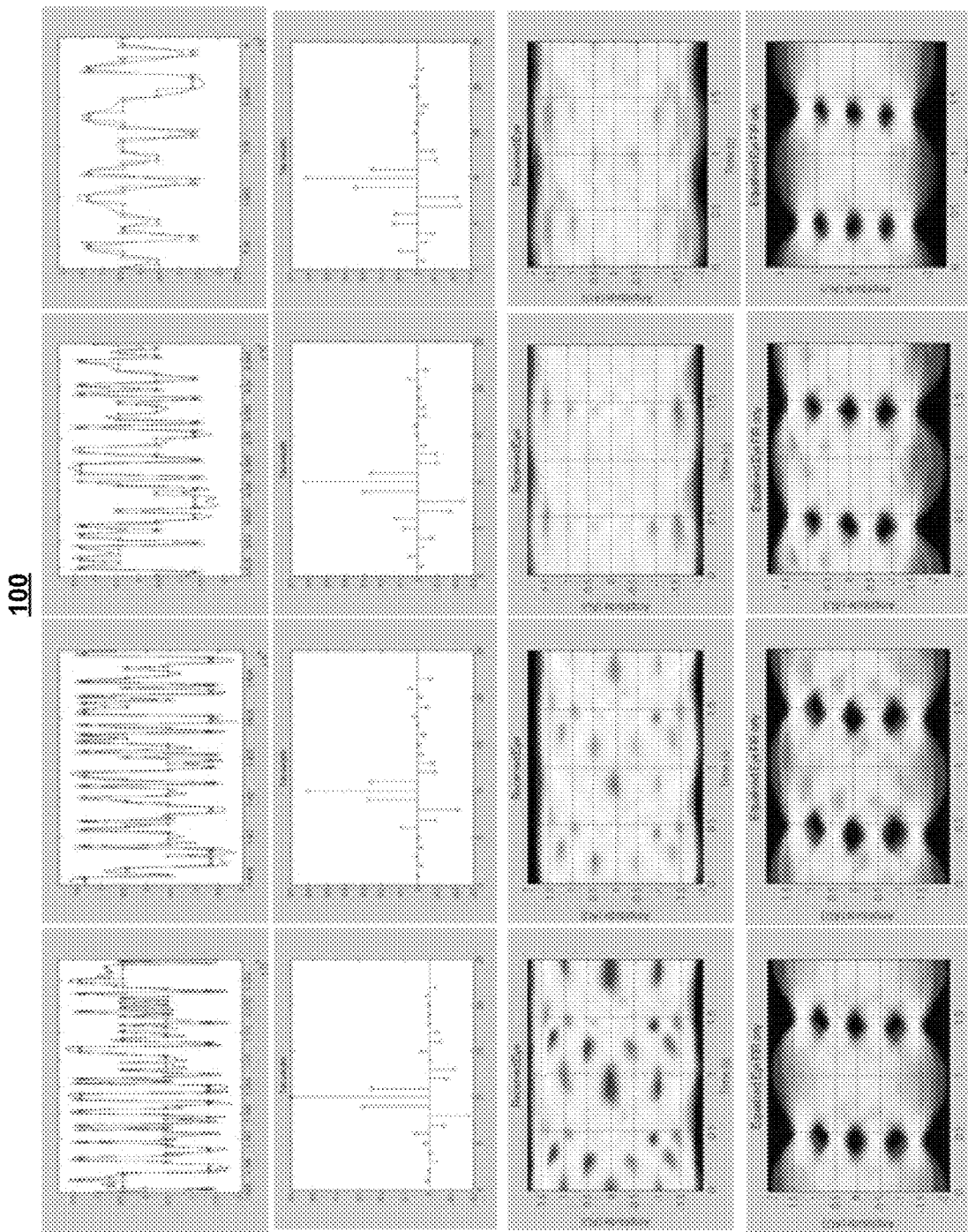
FIG. 1 illustrates the limitations of PAM4 modulation schemes proposed in the prior art that require a feed-forward equalizer.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Components, or modules, shown in diagrams are illustrative of exemplary embodiments of the invention and are meant to avoid obscuring the invention. It shall also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," or "communicatively coupled" shall be understood to include direct connections, indirect connections through one or more intermediary devices, and wireless connections.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. Furthermore, the use of memory, database, information base, data store, tables, hardware, and the like may be used herein to refer to system component or components into which information may be entered or otherwise recorded.

Furthermore, it shall be noted that: (1) certain steps may optionally be performed; (2) steps may not be limited to the specific order set forth herein; (3) certain steps may be performed in different orders; and (4) certain steps may be done concurrently.

In various embodiments DSP-free coherent receiver architectures for distances low enough that polarization mode dispersion and chromatic dispersion are negligible render the use of a DSP-based equalizer unnecessary. To make an attractive advance on the data rates currently being standardized, dual polarization schemes are needed that reach 4 bits per symbol using quaternary modulation schemes in two orthogonal polarizations. Therefore, managing polarization without recourse to ultra-fast DSP is desirable. Some designers have proposed an architecture that uses the system shown in block diagram in FIG. 2.

Figure 2:
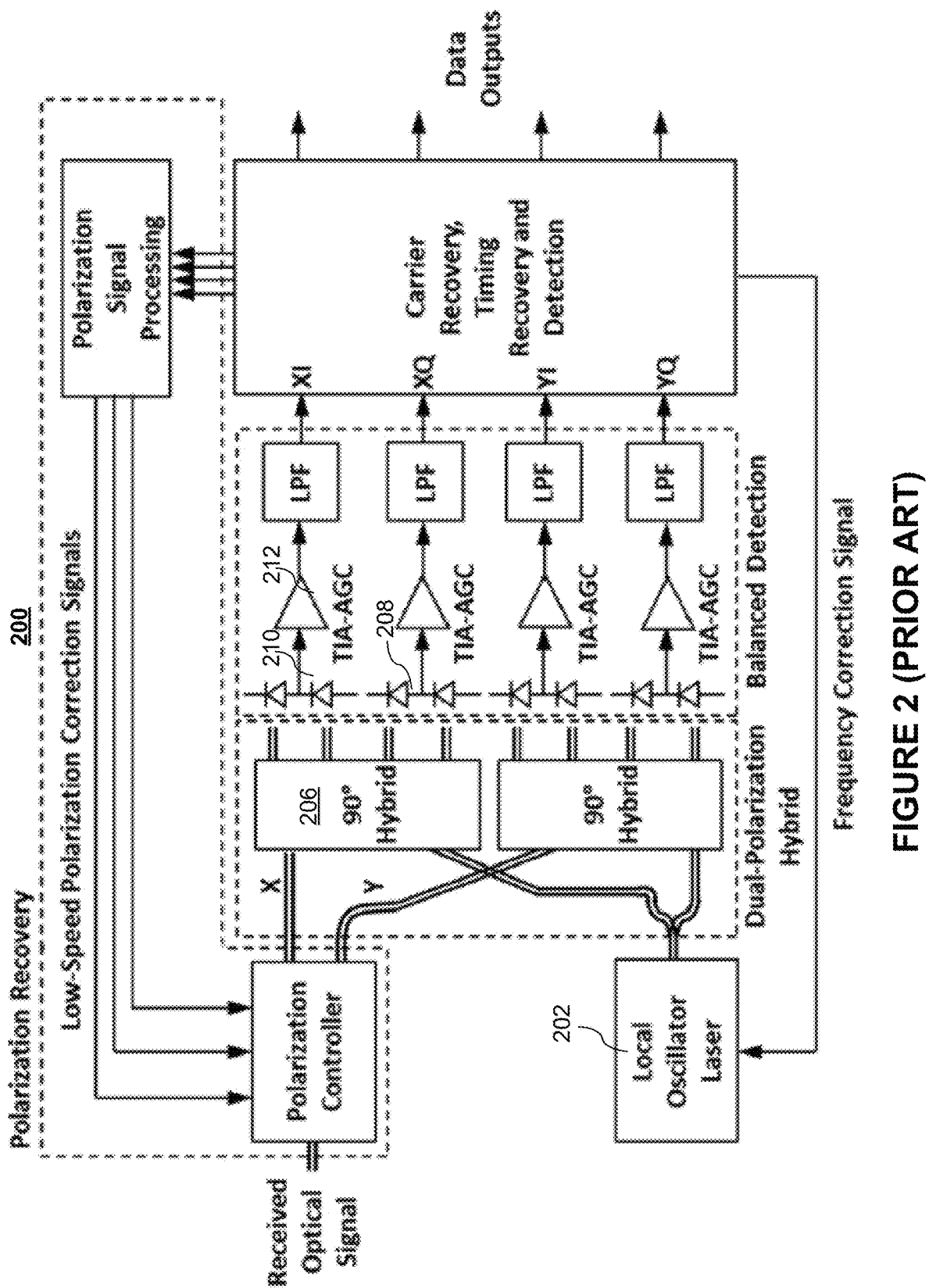
FIG. 2 is a block diagram of a dual polarization-quadrature phase shift keying (DP-QPSK) receiver that is based on analog signal processing, as proposed in the prior art.
Figure 3:
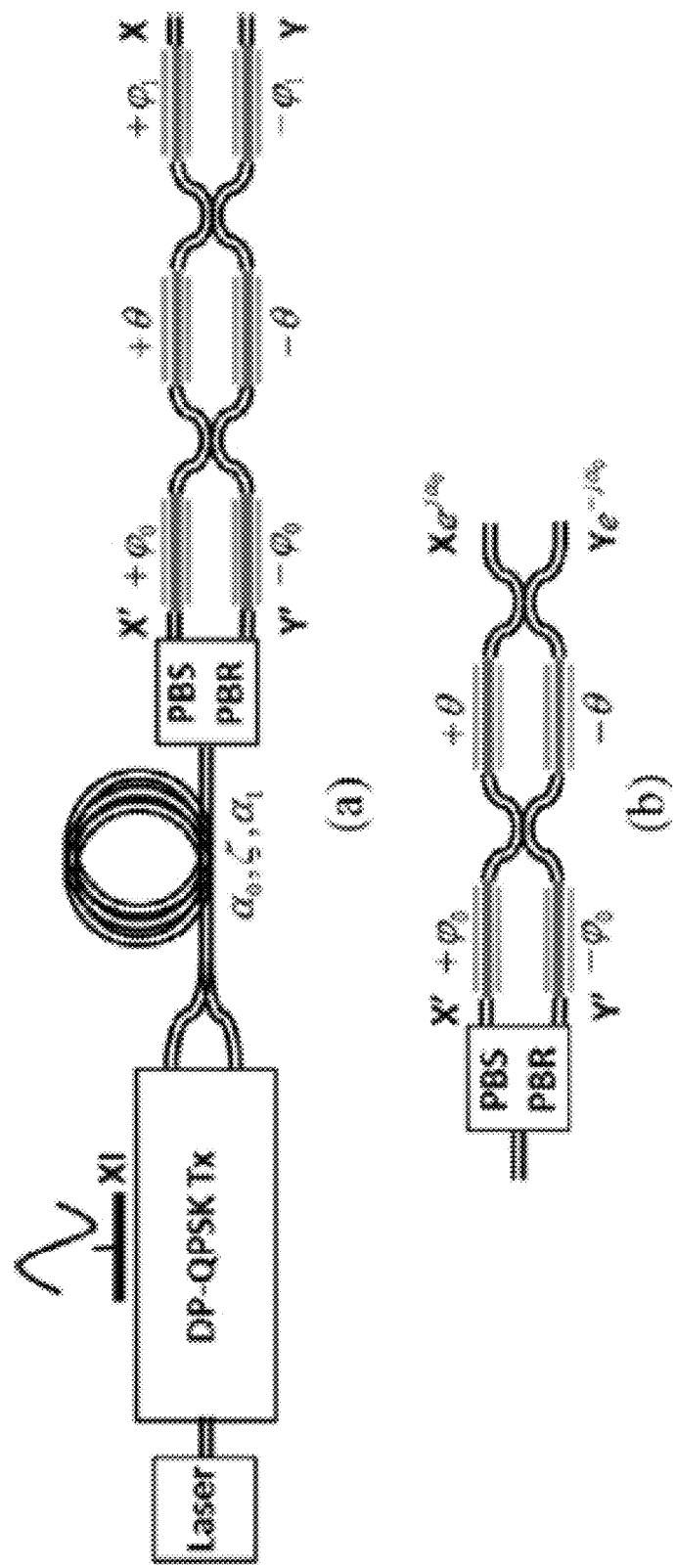
FIG. 3 is a polarization controller for the DP-QPSK receiver shown in FIG. 2, as proposed in the prior art.

FIG. 2 is a block diagram of a DP-QPSK receiver that is based on analog signal processing. DP-QPSK receiver 200 is a homodyne receiver that has an on-channel laser 202 that acts as the local oscillator. The arrangement of polarization beam splitter (PBS) and 90° hybrids 206 is designed to provide balanced quadrature light outputs for each of the two orthogonal polarizations, which are incident on eight photo-diodes 208 that are arranged in balanced pairs. This arrangement results in four bipolar photo currents 210 that are amplified by respective Trans Impedance Amplifiers (TIAs) 212, corresponding to I- and Q-phases of the X- and Y-polarizations, respectively. Thus, four branches (i.e., XI, XQ, YI, YQ) of receiver 200 are available for further signal processing, which, ideally, is kept in the analog domain. Details of the proposed polarization controller for DP-QPSK receiver 200 are shown in FIG. 3.

In order to avoid having to manipulate polarization states in the DSP domain, which would normally be the expectation for a DSP-based coherent receiver, some designers have proposed polarization control to be implemented using optical modulators. To facilitate this, a 50 kHz pilot tone is added at the transmitter to the x-polarization, in-phase signal branch such that a control loop algorithm running in a low-power CPU can monitor and adjust the polarization states to correct for polarization rotations in two or three degrees of freedom (see FIG. 3).

In order to facilitate polarization control using an electronic feedback loop, a means of providing electrical control of refractive index is required. One approach is to use special electro-optical materials, such as Lithium niobate (LiNbO$_3$) crystals that have refractive indices that are sensitive to and, thus, can be modulated by an electric field. While controllers using Lithium niobate polarization are relatively fast, having dithering speeds in the MHz range, they are relatively expensive. Lower-cost methods that have been proposed include thermo-optic phase shifters, which can be based on silica, silicon, or certain polymers. These will be considerably slower and, therefore, resets that are used to mimic "endless" polarization control will cause significant burst errors. Generally speaking, high voltages for electro-optic modulation or micro heaters for thermo-optic modulation make implementation unnecessarily cumbersome. Overall, cost and size considerations render the existing or proposed uses of electro-optical, or electro-thermo-optical methods to control polarization a major impediment to the commercial attractiveness of a DSP-free coherent optical receiver as they result in designs that are very expensive, bulky, and almost impractical to use.

Accordingly, what is needed are systems and methods that achieve the agility of a lithium niobate polarization control in the electrical domain, without requiring digitization of the full-bandwidth signal path to enable a DSP approach.

Systems and methods presented herein provide for analog polarization correction that allows for fast and "endless" polarization control at much lower cost and size than existing electro-optical methods. The following paragraphs provide a mathematical framework for understanding operations for correcting possible changes of State of Polarization (SOP) within a fiber plant.

Neglecting losses and assuming monochromatic, polarized light as stimulus, the output of an optical fiber channel can be written as:

$$\begin{bmatrix} E_{xo} \\ E_{yo} \end{bmatrix} = J \begin{bmatrix} E_{xi} \\ E_{yi} \end{bmatrix} \quad \text{(Eq. 1)}$$

where J is a unitary 2×2 Jones matrix that describes the polarization transformation of the fiber plant.

In general, a 2×2 unitary matrix, U, can be factored into a form $U = D_1 O D_2$, where $D_1$, $D_2$ are complex diagonal matrices and O is a real orthogonal matrix. Thus, the Jones matrix in Eq. 1 may be expressed as:

$$J = e^{j\psi/2} \begin{bmatrix} e^{j\phi_1/2} & 0 \\ 0 & e^{-j\phi_1/2} \end{bmatrix} \begin{bmatrix} \cos\theta & \sin\theta \\ -\sin\theta & \cos\theta \end{bmatrix} \begin{bmatrix} e^{j\phi_0/2} & 0 \\ 0 & e^{-j\phi_0/2} \end{bmatrix}, \quad \text{(Eq. 2)}$$

where $\psi$, $\phi_1$, $\theta$, and $\phi_0$ are four real parameters, with $\phi_0$ representing relative phase shift between X- and Y-polarization signals, before a plane polarization rotation by $\theta$, and a subsequent relative phase shift by $\phi_1$. Finally, $\psi$ represents the absolute phase.

In embodiments, it is assumed that the real orthogonal matrix in Eq. 2 represents a rotation rather than a reflection, permutation, or any other known type of orthogonal 2×2 matrix. This assumption is justified because the physics of fiber transmission gives rise only to rotations, and no other types of transformation previously mentioned. Therefore, in embodiments, Eq. 2 represents the changes in the fiber channel that may be reversed or inverted in order to recover the signals in their original, orthogonal polarization channels.

In embodiments, in order to invert the effect of the Jones matrix, J, the order of the factorized components may be reversed, and each component may be individually inverted such that:

$$J^{-1} = e^{-j\psi/2} \begin{bmatrix} e^{j-\phi_0/2} & 0 \\ 0 & e^{j\phi_0/2} \end{bmatrix} \begin{bmatrix} \cos\theta & -\sin\theta \\ \sin\theta & \cos\theta \end{bmatrix} \begin{bmatrix} e^{-j\phi_1/2} & 0 \\ 0 & e^{j\phi_1/2} \end{bmatrix} \quad \text{(Eq. 3)}$$

However, if, in embodiments, the demodulators in the X- and Y-polarization branches are insensitive to absolute phase (DQPSK) or have independent carrier recovery, the rotations represented by $\phi_0$ or $\psi$ may not need to be performed. As a result, correction prior to demodulation may be reduced to:

$$\begin{bmatrix} E_{xr} \\ E_{yr} \end{bmatrix} = \begin{bmatrix} \cos\theta & -\sin\theta \\ \sin\theta & \cos\theta \end{bmatrix} \begin{bmatrix} e^{-j\phi_1/2} & 0 \\ 0 & e^{j\phi_1/2} \end{bmatrix} \begin{bmatrix} E_{xo} \\ E_{yo} \end{bmatrix} \quad \text{(Eq. 4)}$$

Note that it may be impossible to invert the polarization rotation by $\theta$ without first inverting the phase rotation by $\phi_1$. Advantageously, in embodiments, only these two specific de-rotations are applied to provide signals suitable for demodulation.

Derivation of suitable control signals for $\theta$ and $\phi_1$ are further discussed in greater detail below. The following paragraphs describe how these corrections may be efficiently applied in an analog signal path, according to various embodiments of the present disclosure, to perform polarization correction.

First, in embodiments, taking each 2×2 rotation matrix, e.g., in order, and multiplying out the real and imaginary components of each signal involves a phase rotation of the Y-polarization component relative to the X-polarization. This provides:

$$\begin{bmatrix} \cos\phi + j\sin\phi & 0 \\ 0 & 1 \end{bmatrix} \begin{bmatrix} X_i + jX_q \\ Y_i + jY_q \end{bmatrix} = \begin{bmatrix} \cos\phi X_i - \sin\phi X_q + j(\sin\phi X_i + \cos\phi X_q) \\ Y_i + jY_q \end{bmatrix} \quad \text{(Eq. 5)}$$

In embodiments, to simplify, the relative rotation may be lumped into a single branch, e.g., instead of dividing it evenly between both branches.

Similarly, $$\begin{bmatrix} \cos\theta & \sin\theta \\ -\sin\theta & \cos\theta \end{bmatrix} \begin{bmatrix} X_i + jX_q \\ Y_i + jY_q \end{bmatrix} = \begin{bmatrix} X_i\cos\theta + Y_i\sin\theta + j\{X_q\cos\theta + Y_q\sin\theta\} \\ -X_i\sin\theta + Y_i\cos\theta + j\{-X_q\sin\theta + Y_q\cos\theta\} \end{bmatrix} \quad \text{(Eq. 6)}$$

In embodiments, high-bandwidth analog signals are linearly combined with weights that may have different signs and that are determined by the sine and cosine of the two angles $\phi$ and $\theta$. Notably, the rate at which these angles are changing may be many orders of magnitudes lower than the bandwidth of the signal path (e.g., hundreds of kHz vs. 30 GHz). Hence, in embodiments, variable gain amplifiers may be used rather than true multipliers that are designed to support the signal bandwidth on both ports.

Figure 4:
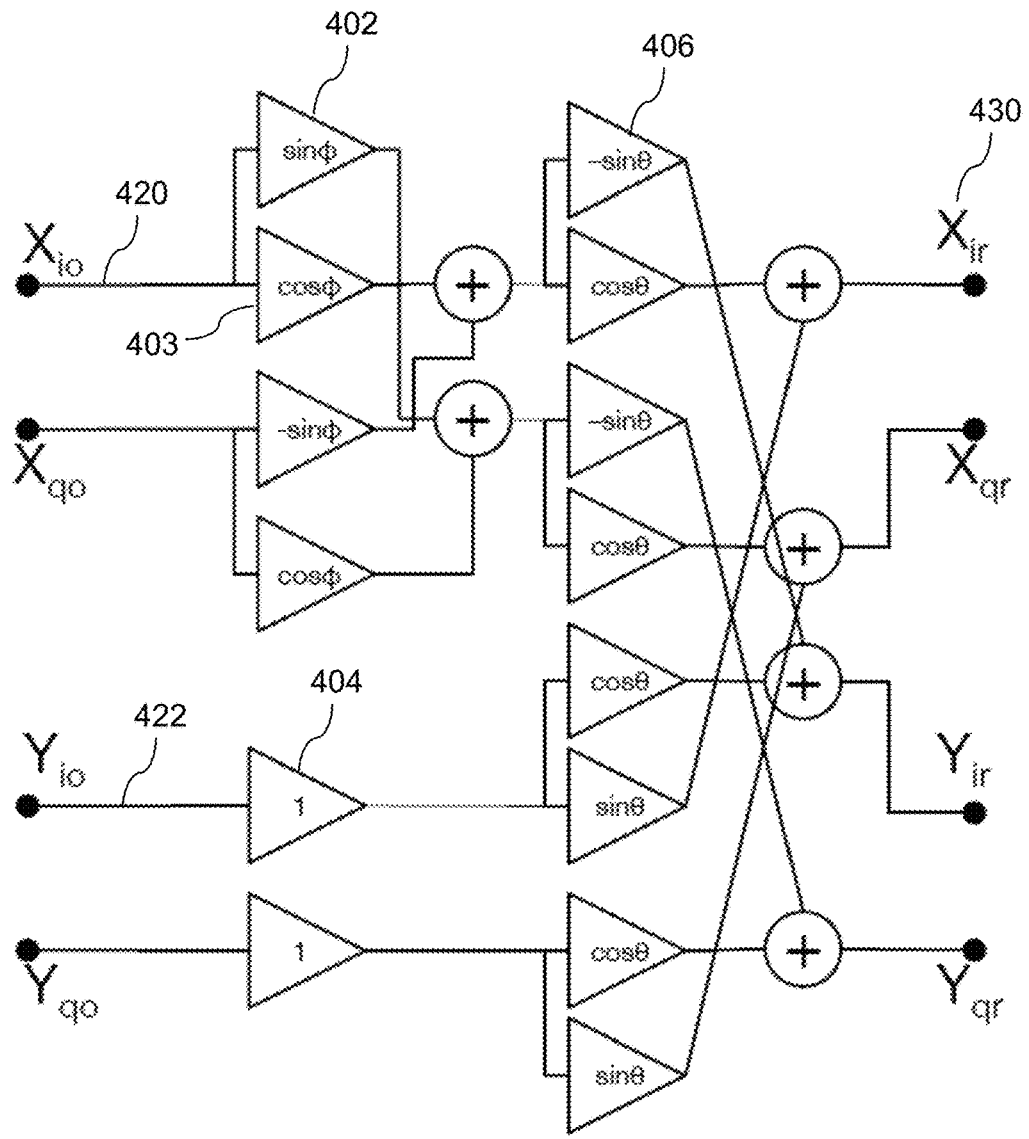
FIG. 4 is a schematic that illustrates an exemplary analog polarization correction circuit according to various embodiments of the present disclosure.

FIG. 4 is a schematic that illustrates an exemplary analog polarization correction circuit according to various embodiments of the present disclosure. Circuit 400 represents one possible analog electronics implementation of the matrix operations discussed with respect to Eq. 5 and Eq. 6 that illustrate that by multiplying two 2×2 matrixes an overall correction function may be generated.

Analog polarization correction circuit 400 comprises inputs that receive X-polarization input signals (e.g., 420), at an X-channel, and Y-polarization signals (e.g., 422), at a Y-channel. Analog polarization correction circuit 400 further comprises amplifiers 404, 406 that may be implemented as variable gain amplifiers. In embodiments, amplifiers 404 in the Y-channel are unity gain amplifiers.

In embodiments, in circuit 400 a first set of amplifiers (e.g., 402, 404) combines two kinds of rotations, e.g., by rotating the phase of X-polarization signal 420 in a manner such as to align it with Y-polarization signal 422 that has not been rotated, as in indicated by unity gain amplifier 404. In embodiments, the four gains, sin $\phi$, cos $\phi$, −sin $\phi$, and cos $\phi$, adjust amplifiers 402 such as to obtain a particular rotation of X-polarization signals 420 relative to Y-polarization signal 422.

It is understood that the resulting signals, when used, e.g., in a receiver, would generally not be aligned with the polarization frame of reference of the receiver. Therefore, in embodiments, the subsequent eight amplifiers 406 cross-multiply the X- and Y-polarization in order to rotate the polarization of the combined signal, e.g., to align the combined signal with the polarization frame of reference of the receiver, such that components resolved into X- and Y-polarization branches of the receiver are substantially orthogonal to each other.

In embodiments, the cross term between the X- and Y-polarizations in the second set of amplifiers (including, e.g., 406) is governed by a second angle $\theta$. In embodiments, angle $\theta$ is selected in a manner such as to restore the orthogonal properties of the X- and Y-polarized signals in the electrical signals carried by the receiver's X- and Y-branches at output terminals 430 labeled $\{X_{ir}, X_{qr}\}$ and $\{Y_{ir}, Y_{qr}\}$ in FIG. 4. As a result, "pure" (i.e., orthogonal) X- and Y-channels are created that, ideally, have perfect separation of polarization signal components.

For simplicity, variable gain amplifiers (e.g., 404, 406) may be designed to implement a pre-defined set of sine or cosine weights corresponding to a pre-defined discrete set of quantized angles, depicted in FIG. 4 as angles $\phi$ and $\theta$. In embodiments, the amplifier gains may be programmable, e.g., according to a tail current defined by a current DAC, such that the computation of the trigonometric weights may be performed using a relatively small microcontroller. In embodiments, sign changes to the gains of amplifiers 402-406 may be conveniently managed by commutating the differential analog signals using CMOS switches.

In embodiments, sign changes may be achieved by adjusting the relative transconductances of two parallel differential amplifiers connected in opposite polarity. However, these are not intended as a limitations on the scope of the present disclosure. Those skilled in the art will appreciate that other trigonometrically-weighted amplifier gains may be implemented according to the currently-prevailing values of the two angles $\phi$ and $\theta$, which may be states of the system under feedback control.

Overall, a first set of amplifiers (e.g., 402, 404) in circuit 400 represents one possible implementation, in analog electronics, of Eq. 5 and a second set of eight amplifiers 406 represents a possible implementation of Eq. 6 in an electronic approach to manipulating polarization.

The analog polarization correction circuit illustrated in FIG. 4 is not limited to the constructional detail shown there or described in the accompanying text. As those skilled in the art will appreciate, other configurations of any number and combination of amplifiers and other circuit components may be used to implement a suitable circuit that performs analog polarization correction using non-dispersive polarization rotations in accordance with various embodiments of the present disclosure. It is understood that while a minimum number of correction steps is desirable, this is not a limitation non the scope of the invention, as any number of steps may be used to perform analog polarization correction.

Figure 5:
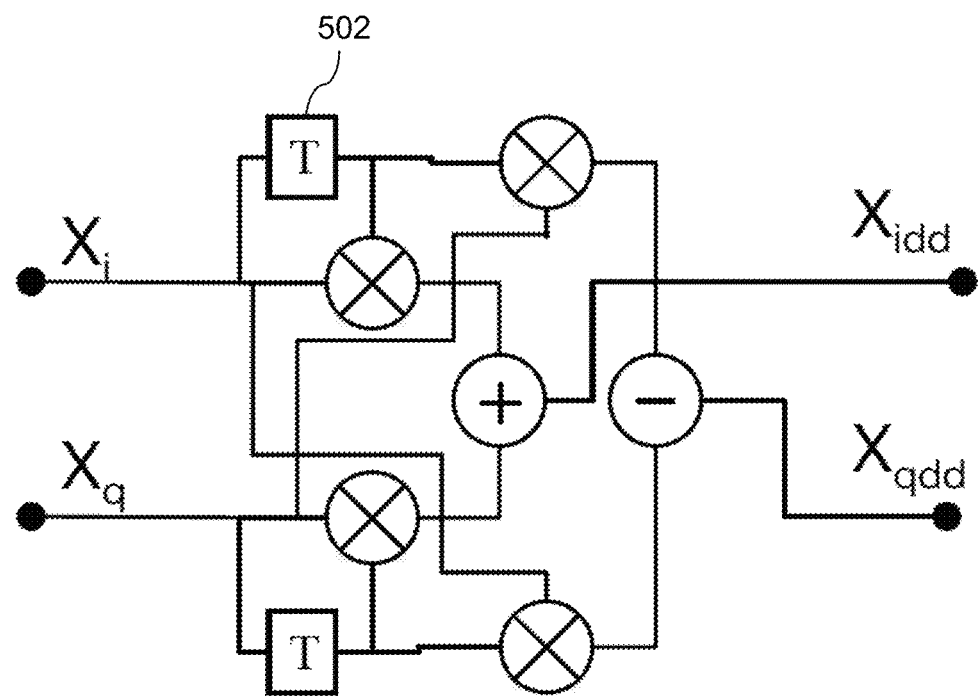
FIG. 5 is a simplified schematic of a common differential demodulator circuit that is insensitive to absolute phase.
Figure 8:
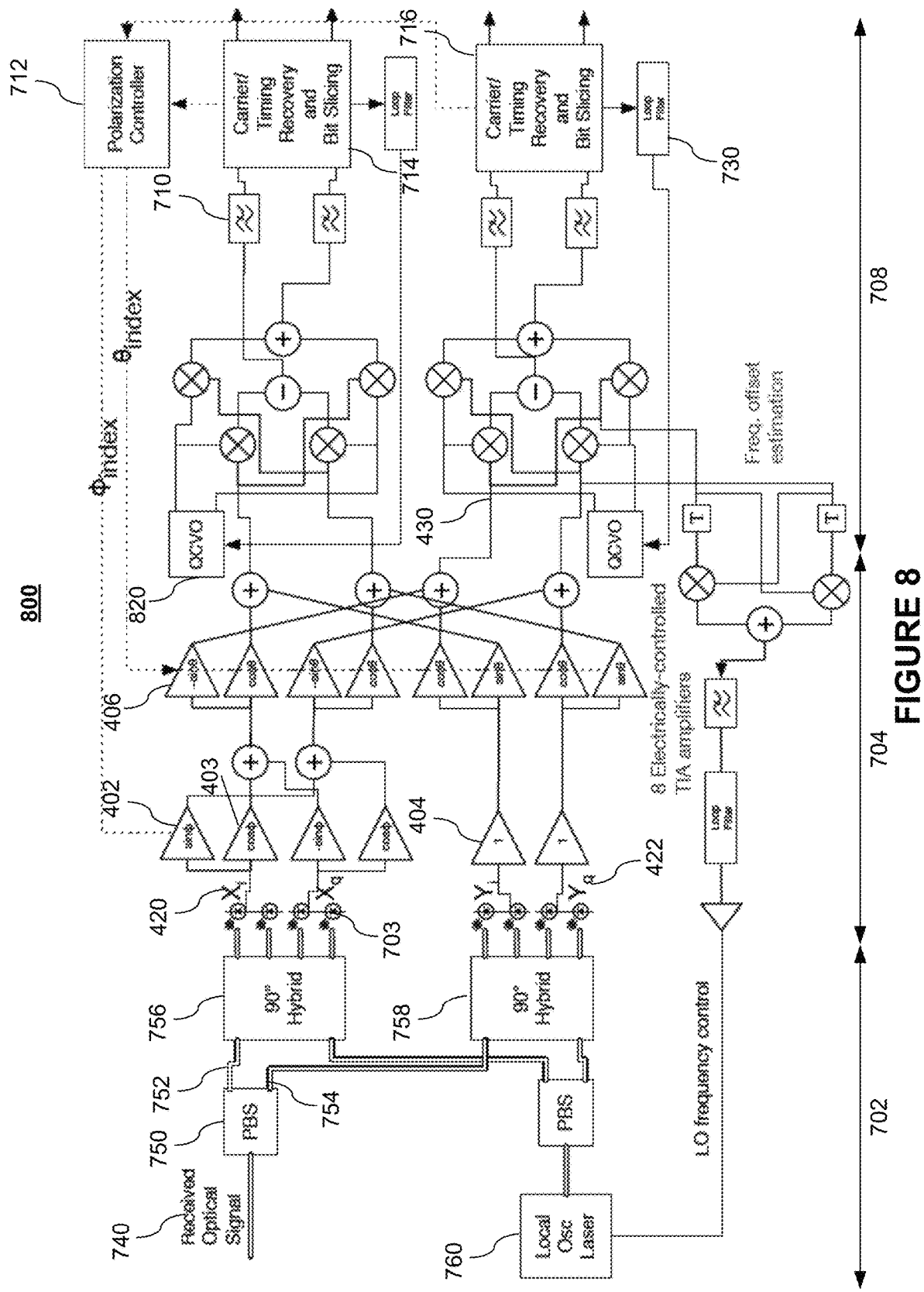
FIG. 8 illustrates a coherent version of the DP-QPSK receiver circuit shown in FIG. 7, in which analog delay blocks are replaced by QVCOs, according to various embodiments of the present disclosure.

FIG. 5 is a simplified schematic of a common differential demodulator circuit that is insensitive to absolute phase, while the argument of its complex output represents the phase change over one symbol period. In embodiments, to avoid the use of expensive multi-bit, ultra-high speed ADCs in the signal path, modulation constellations have negligible phase offset and no frequency offset at the point where hard decisions are made, preferably using a comparator as a single-bit quantizer. For QPSK, which is sensitive to absolute phase, this typically requires a complex, analog PLL using a Costas loop, or similar technique. In embodiments, residual phase error in the polarization control loop is not corrected, thereby requiring independent PLLs in each polarization branch, as shown in FIG. 8. In other embodiments (not shown) the carrier phase error control points may be partitioned into a common phase error and a phase difference between the branches.

An alternative that avoids the need for explicit carrier recovery involves using DQPSK, in which case the recovery to conventional QPSK can be accomplished at baseband, e.g., by multiplying the signal by delayed, complex conjugate version of itself, where the delay is set to one symbol period.

Let $X_i^d$ and $X_q^d$ represent delayed versions of $X_i$ and $X_q$ respectively, where the delay is one symbol period.

It is readily apparent that the phase change over one symbol period is given by $(X_{idd}+jX_{qdd})$, where, $X_{idd}+jX_{qdd}=(X_i+jX_q)(X_i^d-jX_q^d)=X_iX_i^d+X_qX_q^d+j(X_qX_i^d-X_iX_q^d)$. In embodiments, this relationship may be implemented, for example, by differential demodulator circuit 500 shown in FIG. 5.

In operation, while the output of circuit 500 is sensitive to changes in phase, it disregards absolute phase of the input. Frequency offsets at the input are translated to phase offsets at the output and can be therefore tolerated in moderation.

Circuit 500 implements a complex conjugate delay multiply of a complex signal. If a modulation is encoded as phase difference between the current and previous symbol, as is the case in differential modulation schemes, the way to uncover those phase differences is to multiply the current symbol by the complex conjugate of the previous signal, i.e., the angle of the output is the difference angle between the current and previous signals. This may be implemented by a one symbol delay, represented by delay block 502, labeled T in FIG. 5.

Figure 6:
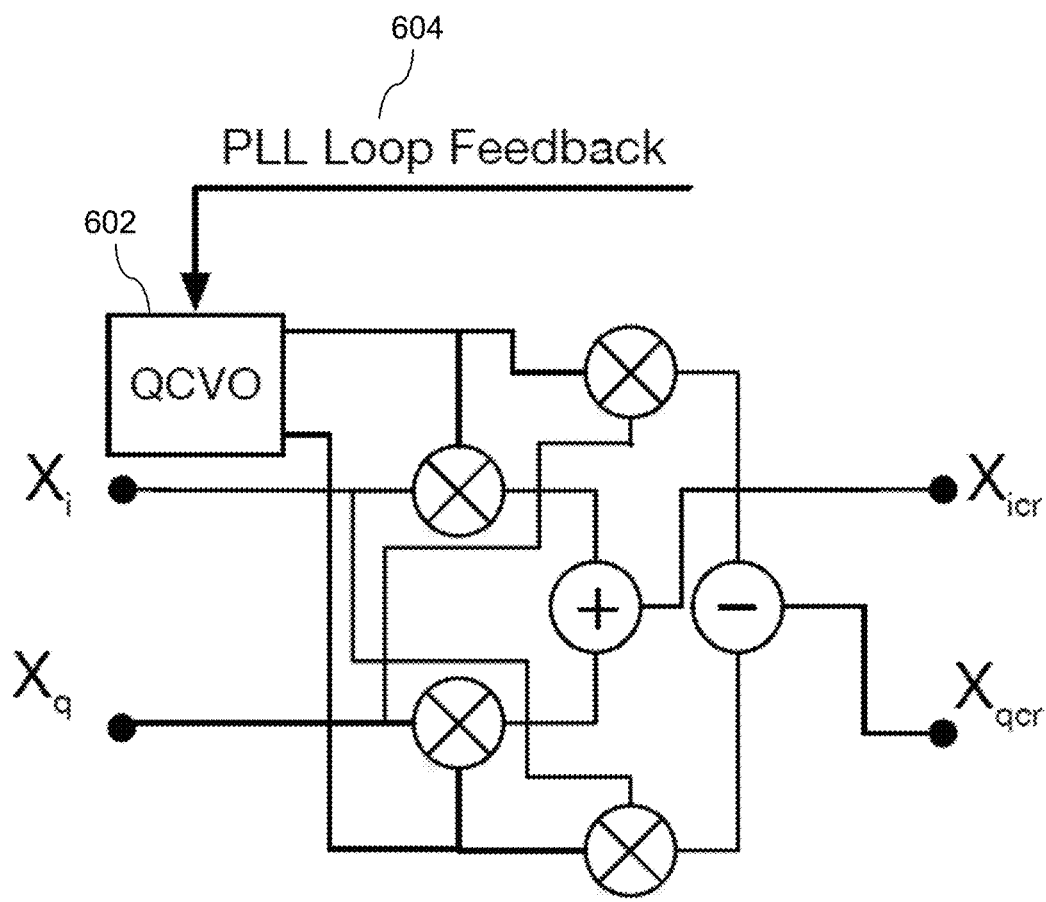
FIG. 6 illustrates an exemplary coherent carrier recovery circuit that utilizes a quadrature voltage-controlled oscillator (QVCO) according to various embodiments of the present disclosure.

FIG. 6 illustrates an exemplary coherent carrier recovery circuit that utilizes a quadrature VCO according to various embodiments of the present disclosure. as shown in FIG. 6, circuit 600 comprises phase-locked QVCO 602 that receives phase-locked loop feedback signal 604. In embodiments, in order to achieve coherent detection, the reference signal is no longer a delayed version of the received signal, but a locally-generated coherent reference from phase-locked QVCO 602 that, e.g., produces a sine and cosine output.

Figure 7:
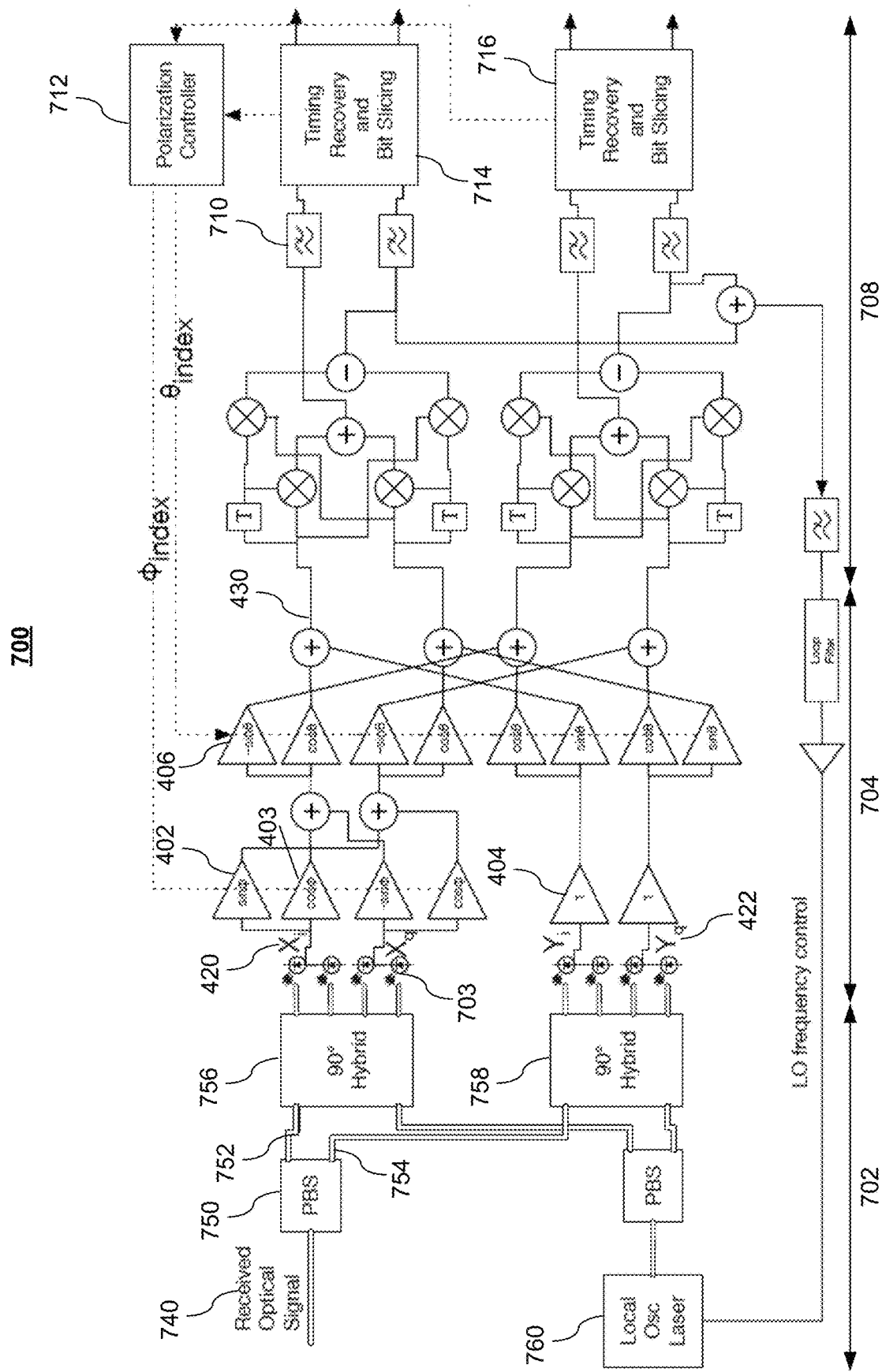
FIG. 7 is a simplified block diagram of an illustrative DP-QPSK receiver circuit that utilizes analog polarization correction according to various embodiments of the present disclosure.

FIG. 7 is a block diagram of an illustrative DP-QPSK receiver circuit that utilizes analog polarization correction according to various embodiments of the present disclosure. Receiver circuit 700 is an optical receiver that may comprise optical front-end 702, photo-diodes 703, analog polarization correction circuit 704, differential modulator circuit 708, low-pass filters 710, polarization controller 712, and timing recovery and bit slicing modules 714, 716. For purposes of brevity, a description of similar components previously described with respect to FIG. 4 through FIG. 6 and their function is not repeated here.

Optical front-end 702 may be any optical front-end known in the art. In embodiments, analog polarization correction circuit 704 processes the output of photo-diodes 703 such as to isolate two polarization streams prior to differential detection by differential modulator circuit 708 that performs a non-linear operation that involves squaring of amplitudes. In embodiments, input signal 740 is transmitted in both the X-polarization and the Y-polarization that are independent from each other in receiver 700 and generate two independent bit streams. In embodiments, this is accomplished by undoing arbitrary, unknown rotations in at least two degrees of freedom that input signal 740 may undergo in fiber channel and that may otherwise affect each other.

In detail, optical front-end 702 receives, e.g., via PBS 750, input signal 740, e.g., from an optical channel. PBS 750 separates input signal 740 into two components, X and Y, that are orthogonal polarizations in two branches, i.e., an X-polarization branch 752 and a Y-branch 754. In embodiments, X-polarization branch 752 is input to 90°-hybrid 756, e.g., a six-port hybrid, and Y-polarization 754 branch is input to 90°-hybrid 756.

In embodiments, hybrid 756, 758 may comprise a connection for local oscillator 760, such as a laser. It is noted that in an ideal homodyne receiver, local oscillator 760 operates on the same wavelength as the to-be-decoded signal. In practice, drift and tolerances may result in less than ideal conditions, such that wavelengths are not exactly the same.

In embodiments, hybrid 756 creates different phases based on the summation of its input signals. In embodiments, in the top branch that comprises hybrid 756, the local oscillator signal is summed with the X-polarization signal 752, and hybrid 756 outputs four phases, e.g., 0°, 180°, 90°, and 270°. Conversely, Y-polarization is processed in the bottom branch by hybrid 758 to output, e.g., four signals having four phases and in the same order as hybrid 754. Photo-diodes 703 may be differential photo-diodes that, in embodiments, process light, which has positive amplitude, i.e., photo-diodes 703 themselves do not generate negative signals. In embodiments, the outputs of adjacent photo-diodes 703 are electrical current signals that are 180° out-of-phase and that represent the difference of, e.g., the 0° output of hybrid 756 and the 180° output, i.e., a bipolar photo current that may assume both positive or negative values. The difference in the photo currents is a signal that represents the in-phase component $X_i$, of X-polarization signal 752. Similarly, photo-diodes 703 on the 90° output and the 270° output generate a bipolar photo current that represents quadrature component, $X_q$, of the X-polarization signal 752, and so on. Overall, hybrids 756, 758 may each output two electrical signals in balanced pairs, e.g., X, and $X_q$ that refer to in-phase polarization and quadrature polarization, respectively. It is understood that these four electrical signals may be amplified, filtered, and further processed throughout the rest of receiver 700.

In embodiments, in-phase signal, $X_i$, and quadrature signal, $X_q$, are input to analog polarization correction circuit 704 that rotates the phases of the signals in the x-polarization branch relative to the phase of the y-polarization signal. In embodiments, an emphasis on the relative value of the phase difference allows to rotate the X-polarization values while not rotating the Y-polarization values. As illustrated in FIG. 7, this may be accomplished by employing the four amplifiers (e.g., 402) in the X-polarization branch to rotate the phase angles φ of the input signals of the amplifiers, while not rotating the phase angles of the input signals of amplifiers (e.g., 404) in the Y-polarization branch that may have unity gain.

The rotated signals may then be processed, e.g., by the set of eight amplifiers 406 that, in embodiments, act as θ-rotators that rotate the combination of the in-phase and quadrature signals such as to align them with the X- and Y-coordinates of receiver 700 in a manner that they become separated according to respective Eq. 5 and Eq. 6. As a result, the output of the θ-rotators is polarization-corrected, thus, providing for a clean separation of the polarization signals. One skilled in the art will appreciate that, in embodiments, a negative sign may be moved into the function of an amplifier itself, for example by commutating differential signal pairs.

In embodiments, the separated polarization signals are provided to differential modulator circuit 708, e.g., to find the phase rotations. The phase angles θ of the output of analog polarization correction circuit 704 represent phase differences that may be processed using conventional bit-slicing and timing recovery to obtain the actual bit stream.

In embodiments, polarization controller may be used to output two phase angles ϕ and θ that, in turn, may control the specific weights and/or signs of the gains of the two sets of amplifiers to efficiently undo the polarization rotation in the fiber channel, such that the output of those summation blocks in analog polarization correction circuit 704 are corrected for polarization and are the same signal as was originally transmitted independently in two channels. In other words, the blocks of amplifiers may be controlled in a feedback loop by phase angles ϕ and θ to successfully accomplish that task and resolve the two polarizations, i.e., the X- and Y-polarization branches of the receiver, separately to obtain orthogonal signals in the two branches prior to processing them using differential detection, etc., in a subsequent block of mixers.

FIG. 8 illustrates a coherent version of the DP-QPSK receiver circuit shown in FIG. 7. Same numerals as in FIG. 7 denote similar elements. As shown in FIG. 8, analog delay blocks in receiver circuit 800 may be replaced by quadrature VCOs 820 (QVCO), according to various embodiments of the present disclosure. In embodiments, receiver circuit 800 further comprises loop filters 730. As depicted in FIG. 8, in embodiments, QVCOs 820 form part of a carrier phase-locked loop (PLL). Since coherent DP-QPSK receiver circuit 800 is concerned with estimating the absolute carrier phase (e.g., for 16-QAM modulation schemes) rather than with differential detection, in embodiments, loop filter 730 is coupled to QVCO 820. In embodiments, QVCO 820 provides the local oscillator to facilitate absolute phase correction in the block of four multipliers 720 that correspond to a complex multiplier.

Figure 9:
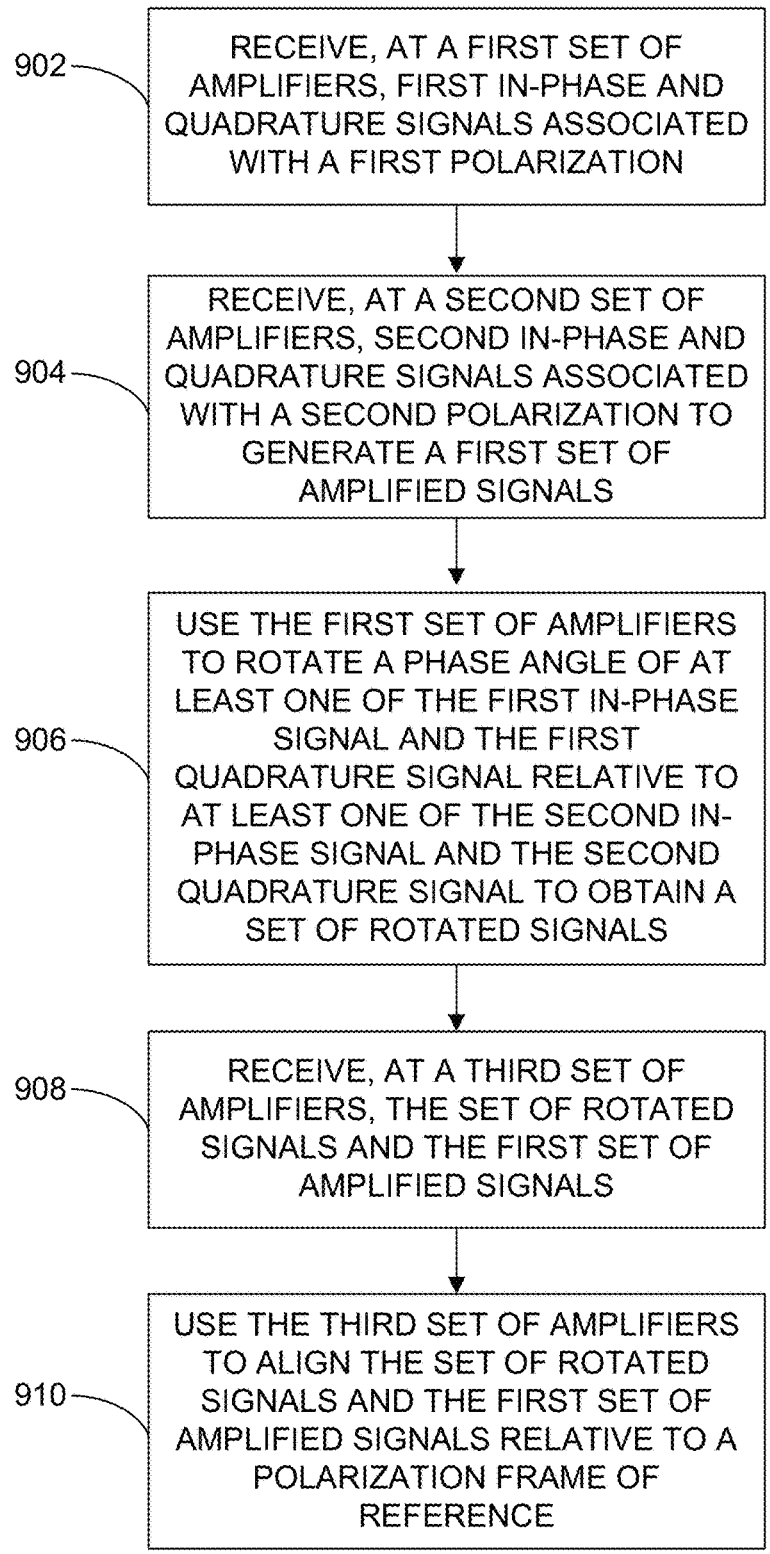
FIG. 9 is a flowchart of an illustrative process for analog polarization control in accordance with various embodiments of the present disclosure.

FIG. 9 is a flowchart of an illustrative process for analog polarization control in accordance with various embodiments of the present disclosure. Process 900 for analog polarization control starts at step 902 when a first set of amplifiers, e.g., programmable variable gain amplifiers, receives in-phase (e.g., $X_i$) and quadrature (e.g., $X_q$) signals that are associated with a first polarization X and with a phase angle (e.g., ϕ).

At step 904, a second set of amplifiers may receive in-phase and quadrature signals associated with a different, second polarization (e.g., Y). In embodiments, at least some of the second set of amplifiers may generate amplified signals that are associated with the same phase angle, here, ϕ.

At step 906, the first set of amplifiers may be used to rotate the phase angle ϕ of at least one of the first in-phase signal and the first quadrature signal relative to at least one of the second in-phase signal and the second quadrature signal to obtain a set of rotated signals;

At step 908, the set of rotated signals and the amplified signals may be input to a third set of amplifiers that receive the rotated signals that may or may not be aligned with a polarization frame of reference at this point.

Finally, at step 910, the third set of amplifiers may be used to rotate at least one of the set of rotated signals and the amplified signals so as to align the polarization with a frame of reference, e.g., a polarization frame of reference of a receiver. As result, components resolved into X- and Y-polarization branches of the receiver will be substantially orthogonal to each other.

Aspects of the present invention may be encoded upon one or more non-transitory computer-readable media with instructions for one or more processors or processing units to cause steps to be performed. It shall be noted that the one or more non-transitory computer-readable media shall include volatile and non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present invention may further relate to computer products with a non-transitory, tangible computer-readable medium that have computer code thereon for performing various computer-implemented operations. The media and computer code may be those specially designed and constructed for the purposes of the present invention, or they may be of the kind known or available to those having skill in the relevant arts. Examples of tangible computer-readable media include, but are not limited to: magnetic media such as hard disks, floppy disks, and magnetic tape; optical media such as CD-ROMs and holographic devices; magneto-optical media; and hardware devices that are specially configured to store or to store and execute program code, such as application specific integrated circuits (ASICs), programmable logic devices (PLDs), flash memory devices, and ROM and RAM devices. Examples of computer code include machine code, such as produced by a compiler, and files containing higher level code that are executed by a computer using an interpreter. Embodiments of the present invention may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

One skilled in the art will recognize no computing system or programming language is critical to the practice of the present invention. One skilled in the art will also recognize that a number of the elements described above may be physically and/or functionally separated into sub-modules or combined together.

It will be appreciated to those skilled in the art that the preceding examples and embodiments are exemplary and not limiting to the scope of the present disclosure. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations.

What is claimed is:

1. An analog polarization control circuit comprising:
   a first set of amplifiers that, in response to receiving a first component of a first polarization signal having a first phase, rotates the first phase by a first phase angle;
   a second set of amplifiers that, in response to receiving a second component of the first polarization signal having a second phase, rotates the second phase by the first phase angle;
   a third and fourth set of amplifiers that, in response to receiving components of a second polarization signal, output unrotated signals; and
   a fifth set of amplifiers that rotate, by a second phase angle, one or more of the unrotated signals and the first and second components of the first polarization signal to obtain a set of rotated signals that reduces at least one component of the second polarization signal from the first polarization signal.

2. The analog polarization control circuit according to claim 1, wherein the second phase angle aligns the set of rotated signals with a polarization frame of reference of a receiver.

3. The analog polarization control circuit according to claim 2, wherein the second phase angle is chosen such that components resolved into X- and Y-polarization branches of the receiver are restored to be substantially orthogonal to each other.

4. The analog polarization control circuit according to claim 3, wherein the fifth set of amplifier cross-multiplies the X- and Y-polarizations to obtain the set of rotated signals to align the set of rotated signals with the polarization frame of reference of the receiver.

5. The analog polarization control circuit according to claim 1, wherein at least one of the first and second set of amplifiers has a variable gain that is positive or negative.

6. The analog polarization control circuit according to claim 5, wherein the variable gain is implemented as a predefined set of trigonometric functions.

7. The analog polarization control circuit according to claim 5, wherein the variable gain is programmed to reduce computations of trigonometric weights and signs that correspond to the first and second phase angles.

8. The analog polarization control circuit according to claim 1, wherein the analog polarization control circuit comprises signal paths that independently process the first and second polarization signals and carries analog signals that represent magnitude and phase within each polarization signal component in a predefined coordinate system.

9. A method for analog polarization control, the method comprising:
   in response to receiving a first set of polarization signals having a first phase and a second set of polarization signals having a second phase, rotating, by a first phase angle, the first phase of one or more signals in the first set of polarization signals relative to the second phase of one or more signals in the second set of polarization signals to generate a set of rotated signals; and
   rotating the set of rotated signals by a second phase angle to align the set of rotated signals with a polarization frame of reference.

10. The method according to claim 9, wherein rotating the set of rotated signals reduces at least a component of the set of second polarization signals from the first set of polarization signals.

11. The method according to claim 9, wherein the set of rotated signals compensates for a polarization rotation of at least one of a first and second component of the first set of polarization signals relative to the second set of polarization signals.

12. The method according to claim 9, wherein rotating the first phase comprises adjusting a gain that is defined by a set of trigonometric functions.

13. The method according to claim 12, further comprising adjusting a polarity of the gain by adjusting relative transconductances of parallel differential amplifiers that are coupled in opposite polarities.

14. The method according to claim 9, wherein the second phase angle is chosen such that components resolved into X- and Y-polarization branches of a receiver are restored to be substantially orthogonal to each other.

15. A system for analog, electronic polarization control, the system comprising:
   an optical front-end that converts an optical signal to a first and second set of polarization components that have respective first and second phases;
   an analog polarization control circuit that, in response to receiving the first and second set of polarization components:
      rotates, by a first phase angle, the first phase of one or more signals in the first set of polarization components relative to the second phase of one or more signals in the second set of polarization components to generate a set of rotated signals;
      rotates the set of rotated signals by a second phase angle to align the set of rotated signals with a polarization frame of reference; and
      outputs separated polarization signals; and
   a differential demodulation circuit that performs a set of non-linear operations on the separated polarization signals.

16. The system according to claim 15, wherein the analog polarization control circuit uses amplifiers having variable gain and trigonometric weights that correspond to the first and second phase angles, one or more of the trigonometric weights comprising a scalar value that has a positive or negative sign.

17. The system according to claim 16, wherein the analog polarization control circuit controls the amplifiers by adjusting the trigonometric weights that control the first and second phase angles.

18. A system according to claim 15, wherein the analog polarization control circuit rotates the set of rotated signals by adjusting gains of one or more amplifiers or attenuators in a plurality of signal paths representing a Cartesian or Complex Number representation of amplitude and phase of each polarization component.

19. A system according to claim 15, wherein the second phase angle is chosen such that components resolved into X- and Y-polarization branches are restored to be substantially orthogonal to each other.

20. A system according to claim 19, wherein the analog polarization control circuit cross-multiplies the X- and Y-polarizations to obtain the set of rotated signals to align the set of rotated signals with the polarization frame of reference of a receiver.

* * * * *